United States Patent
Lee et al.

(10) Patent No.: US 7,621,794 B2
(45) Date of Patent: Nov. 24, 2009

(54) METHOD OF ENCAPSULATING AN ORGANIC LIGHT-EMITTING DEVICE

(75) Inventors: Chung J. Lee, Fremont, CA (US); Atul Kumar, Santa Clara, CA (US); Chieh Chen, Palo Alto, CA (US)

(73) Assignee: International Display Systems, Inc., Lake Forest, CA (US)

( * ) Notice: Subject to any disclaimer, the term of this patent is extended or adjusted under 35 U.S.C. 154(b) by 367 days.

(21) Appl. No.: 11/271,410

(22) Filed: Nov. 9, 2005

(65) Prior Publication Data

US 2007/0105473 A1     May 10, 2007

(51) Int. Cl.
*H05B 33/10* (2006.01)
*H01L 51/56* (2006.01)
*G02F 1/335* (2006.01)
*C03B 27/00* (2006.01)

(52) U.S. Cl. .......... 445/25; 445/24; 313/512; 428/355 R; 428/1.55; 430/20

(58) Field of Classification Search ........... 445/24–25; 313/512

See application file for complete search history.

(56) References Cited

U.S. PATENT DOCUMENTS

| | | | | |
|---|---|---|---|---|
| 3,878,246 A | * | 4/1975 | Mathey et al. | 570/142 |
| 5,538,758 A | | 7/1996 | Beach et al. | |
| 5,686,360 A | | 11/1997 | Harvey, III et al. | |
| 5,757,126 A | | 5/1998 | Harvey, III et al. | |
| 5,771,562 A | | 6/1998 | Harvey, III et al. | |
| 5,930,652 A | * | 7/1999 | Mukerji et al. | 438/459 |
| 6,140,456 A | | 10/2000 | Lee et al. | |
| 6,198,220 B1 | | 3/2001 | Jones et al. | |
| 6,226,890 B1 | | 5/2001 | Boroson et al. | |

(Continued)

FOREIGN PATENT DOCUMENTS

WO    WO 99/21924    5/1999

(Continued)

OTHER PUBLICATIONS http://www.batop.de/information/r_bragg.html, Datop GmbH-Optoelectronics-Bragg relector, BATOP GmbH Semiconductor Optoelectronic devices, (5 Pgs.).

(Continued)

*Primary Examiner*—Sikha Roy
*Assistant Examiner*—Tracie Green
(74) *Attorney, Agent, or Firm*—Alleman Hall McCoy Russell & Tuttle LLP (57) ABSTRACT

A method of encapsulating an organic light-emitting device is disclosed, wherein the device includes a light-emitting portion and an electrical contact portion, the method including forming a polymer layer over the light-emitting portion and the electrical contact portion of the device; forming a separation in the polymer layer between a portion of the polymer layer disposed over the light-emitting portion of the device and a portion of the polymer layer disposed over the electrical contact portion of the device; adhering a film removal structure to the portion of the polymer layer disposed over the electrical contact portion of the device; and removing the film removal structure, thereby causing the removal of the portion of the polymer layer disposed over the electrical contact portion of the device.

33 Claims, 5 Drawing Sheets

U.S. PATENT DOCUMENTS

| | | | |
|---|---|---|---|
| 6,268,695 | B1 | 7/2001 | Affinito |
| 6,495,208 | B1 | 12/2002 | Desu et al. |
| 6,497,598 | B2 | 12/2002 | Affinito |
| 6,522,067 | B1 | 2/2003 | Graff et al. |
| 6,548,912 | B1 | 4/2003 | Graff et al. |
| 6,570,325 | B2 | 5/2003 | Graff et al. |
| 6,573,652 | B1 | 6/2003 | Graff et al. |
| 6,608,283 | B2 | 8/2003 | Liu et al. |
| 6,703,462 | B2 | 3/2004 | Lee |
| 6,740,145 | B2 | 5/2004 | Boroson et al. |
| 6,797,343 | B2 | 9/2004 | Lee |
| 6,866,901 | B2 | 3/2005 | Burrows et al. |
| 6,923,702 | B2 | 8/2005 | Graff et al. |
| 2002/0019081 | A1* | 2/2002 | Denis et al. ............... 438/149 |
| 2002/0195744 | A1* | 12/2002 | Otsuki et al. ........... 264/272.17 |
| 2003/0195312 | A1 | 10/2003 | Lee et al. |
| 2003/0196680 | A1 | 10/2003 | Lee et al. |
| 2003/0198578 | A1 | 10/2003 | Lee et al. |
| 2005/0110006 | A1* | 5/2005 | Aizenberg et al. ............ 257/40 |
| 2005/0129841 | A1* | 6/2005 | McCormick et al. .......... 427/66 |
| 2005/0212419 | A1* | 9/2005 | Vazan et al. ................ 313/512 |

FOREIGN PATENT DOCUMENTS

| | | |
|---|---|---|
| WO | WO 99/22043 | 5/1999 |

OTHER PUBLICATIONS

Iwamoto, et al., Dept. of Chemistry, Rensselaer Polytechnic Institute, Troy, New York, "Crystallization During Polymerization of Poly-p-Xylylene. III. Crystal Structure and Molecular Orientation as a Function of Temperature", Journal of Polymer Science, vol. 13, pp. 1925-1938.

Chung J. Lee, Dept. of Chemistry, Rensselaer Polytechnic Institute, Troy, New York, "Transport Polymerizatiopn of Gaseous Intermediates and Polymer Crystals Growth". Copyright 1977-1978, Pgs. 79-127.

C-L Lang, et al., Rensselaer Polytechnic Institute, center for Integrated Electronics, Troy, New York, Vapor Deposition of Very Low K Polymer Films, Poly(Naphthalene), Poly(Fluorinated Naphthalene), XP-002065704, Mat. Res. Soc. Symp. Proc. vol. 381, Copyright 1995 Materials Research Society, pp. 45-50.

E. Todd Ryan, et al., Center for Materials Science and Engineering, University of Texas, Austin Texas, "Effect of Depositon and Annealing on the Thermomechanical Properties of Parylene Films" XP-001120235, Mat. Res. Soc. Symp. Proc. vol. 476, Copyright 1997, Materials Reasearch Society, pp. 225-230.

Andreas Greiner, "Poly (1,4-xylylene)s: Polymer Films by Chemical Vapour Deposition", Copyright 1997, Elsevier Science Ltd., TRIP vol. 5, No. 1., pp. 12-16.

M.A. Plano, et al., "The Effect of Deposition Conditions on the Properties of Vapor-Deposited Parylene AF-4 Films", XP-001120236, Mat. Res. Soc. Symp. Proc. vol. 476, Copyright 1997, Materials Research Society, pp. 213-218.

J.F. Wilson, Jr., et al., "Study of Hydrogen Annealing of Ultrahigh Molecular Weight Polyethylene Irradiated With High-Energy Protons". Journal Materials Research, vol. 14, No. 11, Copyright 1999, Materials Research Society, pp. 4431-4436.

D. Mathur, et al., "Vapor Deposition of Parylene-F Using Hydrogen as Carrier Gas", Journal Materials Research, vol. 14, No. 1, Copyright 1999, Materials Research Society, pp. 246-250.

Michael Morgen, et al., "Morphological Transition in Fluorinated and Non-Fluorinated Parylenes", XP-001120143, Journal Materials Research, vol. 565, Copyright 1999, Materials Research Society, pp. 297-302.

Jay Lewis, et al., "Thin Film Permeation Barrier Technology for Flexible Organic Light-Emitting Devices", Journal of Selected topics in Quantum Electronics, 2003, pp. 1-13.

Solid State Technology, "A Vacuum Roll-to-Roll Process for Manufacturing OLED'S", Copyright 2005, PennWell Corporation, pp. 1-4.

Solid State Technology, "Integrating a Nonporous Low-K (K=2.2) Film", Copyright 2005, Penn Well Corporation, pp. 1-5.

Solid State Technology, "Plain Talk on Low-K Dielectrics", Copyright 2005, Penn Well Corporation, pp. 1-4.

* cited by examiner

METHOD OF ENCAPSULATING AN ORGANIC LIGHT-EMITTING DEVICE

TECHNICAL FIELD

The present disclosure relates to organic light-emitting device display technology.

BACKGROUND

Displays utilizing organic light-emitting devices (OLEDs) such as organic light-emitting diodes have shown great promise as thinner, lighter-weight displays than current liquid crystal displays (LCDs). An OLED is a device that utilizes an organic species (either a small molecule or a polymer) to emit light under an applied electric field. OLEDs are made out of one or more layers of organic materials stacked between conducting electrodes. A flow of electric current through this stack of materials stimulates the emission of light by the organic materials.

OLED technology is considered superior to LCD technology for use in displays for various reasons. For example, an OLED is an emissive system, creating its own light rather than relying on modulating a backlight. This leads to higher contrast, truer colors, crisper motion, and potentially lower power consumption compared to LCDs. Additionally, OLED displays may be manufactured via simpler and less expensive manufacturing processes than LCD displays.

However, current OLED displays suffer from short lifetimes due to degradation caused by exposure to moisture and oxygen in air. This may prevent the use of the OLEDs in such devices as computer monitors and large screen displays. The OLED displays therefore must be encapsulated to prevent degradation of the organic layers caused by exposure to moisture and oxygen. Thin films of organic polymers and inorganic materials deposited over the OLEDs have been found to lessen damage to the OLED materials caused by such oxidants as moisture and oxygen. Such encapsulation layers are generally only needed over the active (light-emitting) portions of the displays, and not over other device regions, such as areas of the substrate intended for use as electrical contacts for connecting the device to external circuitry. However, traditional patterning and etching techniques generally require complex multi-step processes, and may increase the cost and complexity of an OLED fabrication process if used to pattern an OLED encapsulation structure.

Shadow masking may be used in certain evaporation-type deposition processes to achieve selective deposition or patterned deposition of the evaporated material while avoiding lithographic and/or etching steps. However, shadow masking may not be suitable for use with the vapor-phase deposition of some organic encapsulant materials, which may diffuse into the spaces between the shadow mask and the substrate.

SUMMARY

One embodiment provides a method of encapsulating an organic light-emitting device, wherein the device includes a light-emitting portion and an electrical contact portion, and wherein the method includes forming a polymer layer over the light-emitting portion and the electrical contact portion of the device; forming a separation in the polymer layer between a portion of the polymer layer disposed over the light-emitting portion of the device and a portion of the polymer layer disposed over the electrical contact portion of the device; adhering a film removal structure to the portion of the polymer layer disposed over the electrical contact portion of the device; and removing the film removal structure, thereby causing the removal of the portion of the polymer layer disposed over the electrical contact portion of the device.

Another embodiment provides a method of forming an organic light-emitting device, wherein the method includes forming an electrical contact structure on a substrate; forming a release layer over the electrical contact structure, wherein the release layer is configured to be substantially completely removable from the electrical contact structure; forming an organic light-emitting structure in electrical communication with the electrical contact structure; forming a polymer encapsulant layer over the release layer and the organic light-emitting structure; forming a separation in the polymer encapsulant layer between a portion of the polymer encapsulant layer over the organic light-emitting structure and a portion of the polymer encapsulant layer over the release layer; and removing the release layer and the portion of the polymer encapsulant layer over the release layer.

DETAILED DESCRIPTION OF THE DEPICTED EMBODIMENTS

Figure 1:
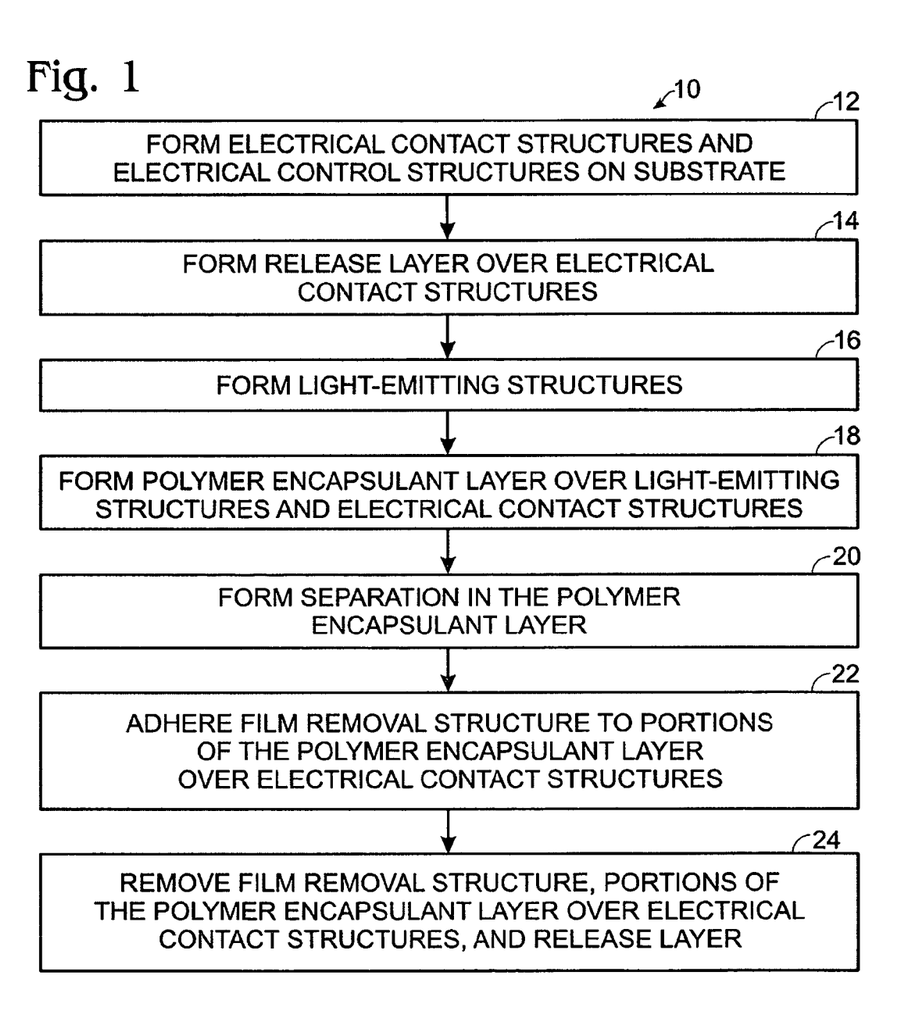
FIG. 1 shows a flow diagram of an embodiment of a first exemplary method of forming an OLED.

FIG. 1 shows, generally at 10, a flow diagram of one exemplary embodiment of forming an OLED. Method 10 includes, at 12, forming one or more electrical contact structures and one or more associated electrical control structures on a substrate. The electrical contact structures allow the formation of external electrical connections to the OLED, and the electrical control structures allow control of the display of an image with the OLED. Examples of suitable electrical control structures include, but are not limited to, thin film transistor (TFT) arrays.

Next, method 10 includes, at 14, optionally forming a release layer over the electrical contact structures. The release layer may assist in removing excess encapsulant material from the electrical contact structures when patterning the encapsulant layer or layers, as described in more detail below. Method 10 further includes, at 16, forming light-emitting structures in electrical communication with the electrical control structures. The light-emitting structures typically include one or more organic light-emitting layers. Many different architectures and materials for light-emitting layers and associated electrodes are well known, and therefore are not described in further detail herein.

As described above, many organic light-emitting materials and electrode materials are sensitive to atmospheric oxidants such as water vapor and oxygen. Therefore, method 10 includes, at 18, forming a polymer encapsulant layer over the light-emitting structures to serve as a protective barrier against such compounds. This layer may be deposited over the light-emitting structures and the electrical contact structures.

Method 10 further includes removing those portions of the polymer encapsulant layer that cover the electrical contact structures. First, at 20, a separation is formed in the polymer encapsulant layer. The separation may be formed between, for example, portions of the polymer encapsulant layer that cover the electrical contact structures and portions of the polymer encapsulant layer that cover the light-emitting structures. Next, method 10 includes, at 22, adhering a film removal structure to portions of the polymer encapsulant layer that are disposed over the electrical contact structures, and then removing the film removal structure at 24. Because the film removal structure is adhered to portions of the polymer encapsulant layer disposed over the electrical contact structures, removal of the film removal structure causes removal of the polymer encapsulant layer and the release layer from over the electrical contact structures. Removal of the polymer encapsulant layer and optional release layer from over the electrical contact structures produces a substrate having an encapsulated OLED and an exposed electrical contact structure. These processes are described in more detail below in reference to FIGS. 2-15.

Method 10 offers various advantages over conventional methods of forming and patterning OLED encapsulant layers. For example, by patterning the encapsulant layer after forming the encapsulant layer, the patterning steps may be performed under ordinary atmospheric conditions. In contrast, where the encapsulant layer is patterned via contact masking and where the mask is applied after deposition of the organic light-emitting material or materials, the mask must be aligned with the substrate and applied to the substrate while maintaining a vacuum to prevent air from damaging the organic light emitting materials and electrode materials during encapsulant deposition. As an additional advantage, precise alignment of the removal structure may not necessary when adhering the removal structure to the portions of the encapsulant layer to be removed, whereas precise alignment of the mask may be necessary where masking is used to pattern the encapsulant layer or layers. These and other advantages are described in more detail below.

Figure 2:
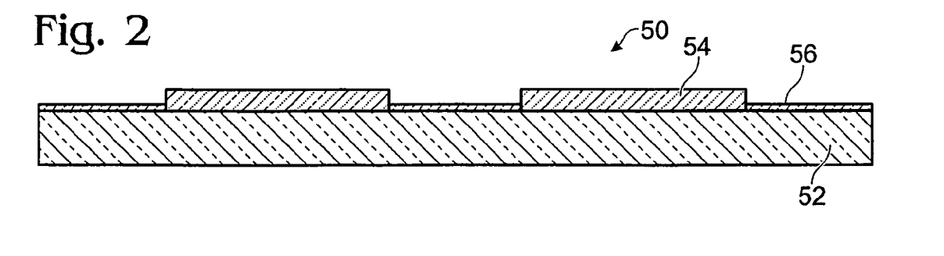
FIG. 2 is a schematic view of an embodiment of a substrate having a plurality of electrical control structures and a plurality of electrical contact structures disposed thereon.

FIG. 2 shows, generally at 50, an exemplary embodiment of two partially fabricated OLED devices on a substrate 52, with each device having electrical control structures 54 and electrical contact structures 56 formed thereon. Any suitable material may be used for substrate 52. Examples include, but are not limited to, transparent glass and plastic materials that can permit emitted light to pass through the substrate. Where the substrate is formed from a plastic material, an additional encapsulant structure (not shown) may be provided between the substrate and the electrical control/electrical contact structures to provide protection against atmospheric moisture and oxygen diffusing through the plastic substrate.

Electrical control structures 54 may be any suitable structures for controlling an emission of light by an organic material, including but not limited to TFT arrays. Likewise, electrical contact structures 56 may be formed from any suitable material(s), and may include any suitable structure(s) for forming appropriate external electrical contacts to the OLED. Examples of suitable materials include, but are not limited to, indium tin oxide (ITO).

Figure 3:
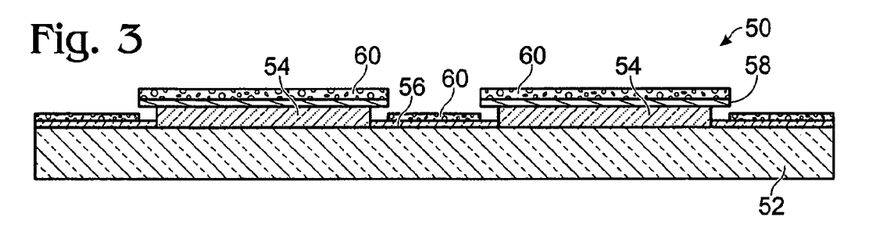
FIG. 3 is a schematic view of the substrate of FIG. 2, with an embodiment of a contact mask disposed over the electrical control structures and a release layer disposed over the electrical contact structures.
Figure 4:
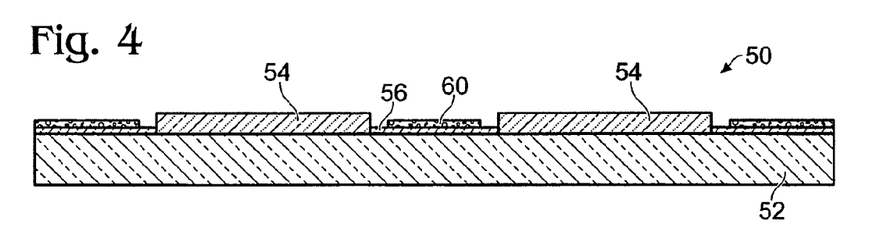
FIG. 4 is a schematic view of the substrate of FIG. 3, with the contact mask removed.

Referring next to FIG. 3, a contact mask 58 is shown for masking electrical control structures 54 during the deposition of the release layer 60. Removal of contact mask 58 leaves release layer 60 deposited only over electrical contact structures 56, as depicted in FIG. 4.

Any suitable material may be used to form release layer 60. Suitable materials include materials that bind weakly, or not at all, to the surfaces of electrical contact structures 56, and materials that can be substantially completely removed from the surfaces of electrical contact structures 56 without leaving behind detrimental amounts of residues. In specific embodiments, release layer 60 may be formed from polyacrylosiloxane materials. These materials may be deposited as a monomer onto electrical contact structures 56 and contact mask 58, and then polymerized via exposure to UV light or other suitable energy source. Specific embodiments of acrylosiloxane monomers include, but are not limited to, monomers having a general structure of $CH_2{=}CH(R){-}COO{-}(CR'R)_x{-}O{-}SiOR''OR'''OR''''$, wherein R and R' each is an H, alkyl, or an aromatic radical, and in more specific embodiments may be $CH_3$; x is an integer ranging from 1 to 10, and in more specific embodiments may be an integer ranging from 2 to 4; and R'', R''' and R'''' each is an alkyl or aromatic radical, and in more specific embodiments may be $CH_3$ and/or $C_6H_5$. In yet further specific embodiments, release layer 60 may be formed from siloxane acrylate monomers having relatively large amounts (>60% by weight of the acrylosiloxane film) of monomer wherein R'', R''' and R'''' are each $CH_3$. While mask 58 is depicted as being a contact mask, it will be appreciated that any other suitable type of mask may be used, including but not limited to shadow masks. Other suitable release monomers include, but are not limited to, vinyl siloxanes, epoxy-modified siloxanes etc. Acrylosiloxanes may offer the advantages of being readily available, obtainable at low cost and UV curable without addition of an initiator such as a metallic catalyst, which may leave behind metal ion contaminants that may damage the performance of the resulting OLEDs.

Figure 5:
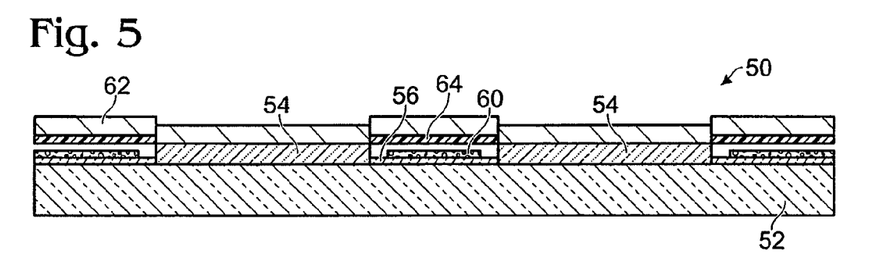
FIG. 5 is a schematic view of the substrate of FIG. 4, with an embodiment of a shadow mask disposed over the electrical contact structures and release layer and with an embodiment of organic light-emitting structures disposed over the electrical control structures.

Referring next to FIG. 5, after forming the optional release layer 60, other active device layers of the OLED may be formed. These layers are represented collectively by layers 62 in FIG. 5. Active device layers 62 may include, but are not limited to, vacuum-deposited layers such as organic light-emitting materials and/or environmentally-sensitive, electrode materials. Due to the sensitivity of many of these materials to oxidants in air, these layers are generally deposited without breaking vacuum. A shadow mask 64, which may be easily applied under vacuum, may be used to mask electrical contact structures 56 and release layer 60 during the deposition of active device layers 62.

Figure 6:
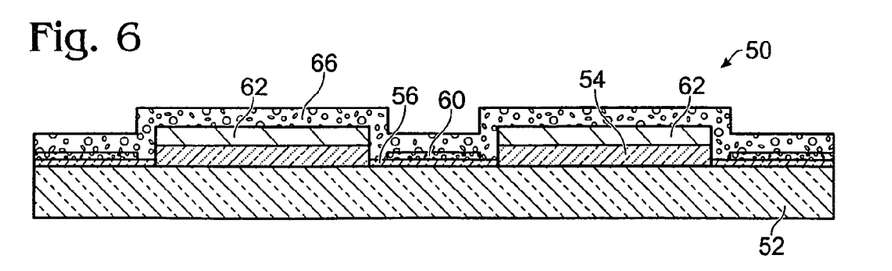
FIG. 6 is a schematic view of the substrate of FIG. 5, with an embodiment of a polymer encapsulant layer disposed over the organic light-emitting structures and the electrical contact structures.

Referring next to FIG. 6, after depositing active device layers 62 and while still under vacuum, shadow mask 64 may be removed and polymer encapsulant layer 66 may be deposited over active device layers 62, electrical contact structure 56 and release layer 60. This is in contrast to various prior methods of depositing a polymer encapsulant layer, which involve masking the electrical contact structures before depositing the polymer encapsulant layer, and which may require breaking vacuum and utilizing a dry box to apply the masking materials.

Any suitable polymer material may be used as polymer encapsulant layer 66. Examples include, but are not limited to, parylene-based polymers. "Parylene-based" materials include polymers having a repeating unit of ($-CZ^1Z^2-$Ar$-CZ^3Z^4-$), wherein Ar is an aromatic moiety (unsubstituted, partially substituted or fully substituted), and wherein $Z^1$, $Z^2$, $Z^3$ and $Z^4$ are similar or different. In one specific example, Ar is $C_6H_{4-x}X_x$, wherein X is a halogen, and $Z^1$, $Z^2$, $Z^3$ and $Z^4$ are the same or different and each individually is H, F or an alkyl or aromatic group. More specific examples of such parylene-based materials include "PPX-F", which has a repeat unit of ($-CF_2-C_6H_4-CF_2-$), and may be formed from various precursors, including but not limited to $BrCF_2-C_6H_4-CF_2Br$; fully fluorinated poly(paraxylylene) ("FPPX-F"), which has a repeat unit of ($-CF_2-C_6F_4-CF_2-$); and unfluorinated poly(paraxylylene) ("PPX-N"), having a repeat unit of ($-CH_2-C_6H_4-CH_2-$). It will be appreciated that these specific parylene-based materials are set forth for the purpose of example, and are not intended to be limiting in any sense.

Many parylene-based polymer films may be formed via the CVD technique of transport polymerization, as disclosed in U.S. Pat. No. 6,797,343 to Lee, which is hereby incorporated by reference. Transport polymerization involves generating a gas-phase reactive intermediate from a precursor molecule at a location remote from a substrate surface and then transporting the gas-phase reactive intermediate to the substrate surface for polymerization. For example, PPX-F may be formed from the precursor $BrCF_2-C_6H_4-CF_2Br$ by the removal of the bromine atoms, thereby forming the reactive intermediate $*CF_2-C_6H_4-CF_2*$ (wherein * denotes a free radical), at a location remote from the deposition chamber, as described in U.S. patent application Ser. No. 10/854,776 of Lee et al., filed May 25, 2004, the disclosure of which is hereby incorporated by reference. This reactive intermediate may then be transported into the deposition chamber and condensed onto a substrate surface, where polymerization takes place.

After depositing polymer encapsulant layer 72, further processing may be performed to modify the physical properties of the layer as desired. For example, in the specific example of parylene-based polymer films such as PPX-F, careful control of deposition chamber pressure, reactive intermediate feed rate and substrate surface temperature can result in the formation of a parylene-based polymer encapsulant film having a high level of initial crystallinity. If desired, the film may then be annealed to increase its crystallinity and, in some cases, to convert it to a more dimensionally and thermally stable phase. Methods for forming semi- and highly crystalline parylene-based polymer films are described in U.S. Pat. No. 6,703,462 to Lee, the disclosure of which is hereby incorporated by reference.

The conditions under which such growth occurs may depend upon variables such as the substrate temperature, the deposition system pressure, reactive intermediate feed rate, and system leak rate (system leakage can introduce free-radical scavengers, such as oxygen, water, etc. from the outside atmosphere that can terminate growth of the chains of the parylene-based polymers). In the specific example of PPX-F, examples of suitable ranges for these variables include, but are not limited to, the following: deposition chamber pressures of approximately 1 to 100 mTorr (and, in specific embodiments, approximately 5 to 25 mTorr); substrate temperatures of approximately 10 to −80 degrees Celsius; leakage rates of approximately 2 mTorr/min or less (and, in specific embodiments, as low as 0.4 mTorr/min or less); and reactive intermediate feed rates of approximately 1 to 20 sccm. It will be appreciated that these ranges are merely exemplary, and that processing conditions outside of these ranges may also be used.

The crystallinity of an as-deposited, semi-crystalline parylene-based polymer film may be improved by annealing the film after deposition. This may be advantageous in some situations, as highly crystalline polyparylene-based films may offer improved moisture and oxygen barrier characteristics. The use of an annealing process may improve the crystallinity of the semi-crystalline parylene-based polymer film from the initial 10% to as high as 70%. While annealing may improve the moisture- and oxygen-barrier properties of a parylene-based polymer film, it will be appreciated that even an as-deposited, un-annealed parylene-based polymer film formed via the methods described above may be used as an OLED encapsulant layer.

Annealing may also convert the parylene-based polymer barrier films to more thermally stable phases. Many parylene-based polymers, including but not limited to PPX-F and PPX-N, may have several different solid phases that exist at different temperatures and/or pressures. For example, the phase diagram of PPX-F includes at least an alpha phase, a beta-1 phase and a beta-2 phase. The alpha phase is a solid phase that exists at lower temperatures. When forming a PPX-F film by transport polymerization, relatively large amounts of alpha phase material may be initially formed. PPX-F undergoes an irreversible phase transition between the alpha phase and beta-1 phase when heated to a temperature of approximately 200-290° C. Therefore, an annealing step may be used to convert an as-deposited PPX-F film to a more dimensionally stable beta-1 phase. Furthermore, PPX-F undergoes a reversible beta-1 to beta-2 phase transition at a temperature of 350-400° C. PPX-F films may be trapped in the beta-2 phase by first heating to a temperature above the beta-1 to beta-2 phase transition temperature on a hotplate or in an oven, holding the PPX-F film at 350 to 400° C. for a duration of, for example, 2 to 30 minutes, and then cooling the film at a fairly rapid rate, for example, between 30 and 50° C./sec, to a temperature below the beta-1 to beta-2 phase transition temperature. In this case, an annealing step followed by a rapid cooling step may be used to trap a film in a beta-2 phase so that, in the event that the film will have to undergo further processing steps at temperatures higher than the beta-1 to beta-2 phase transition temperature, no dimension-changing beta-1 to beta-2 phase transition will occur.

Furthermore, the annealing may be performed under a reductive atmosphere, such as hydrogen mixed with nitrogen or argon, to cap any unreacted polymer chain ends. It will be appreciated that the annealing and cooling conditions described above are merely exemplary, and that suitable annealing conditions outside of the stated ranges may also be used. Furthermore, it will be appreciated that the annealing concepts described above may be extended to other polymer films that have similar or different solid phase boundaries.

Some of the organic materials used as electron transport layers, hole transport layers, and/or light-emitting layers in OLEDs may not be thermally stable at the desired annealing temperatures. For example, some commonly used OLED organic materials are unstable at temperatures as low as 60° C. To protect these layers during an annealing process, more directed annealing methods than hotplate- or oven-based annealing methods may be used. For example, in some embodiments, laser or focused IR techniques may be used to anneal the second parylene-based polymer film 38. The use of a laser or focused IR may allow energy to be delivered to the semi-crystalline parylene-based polymer layers with a relatively high degree of specificity, thereby avoiding delivering unwanted energy to the organic layers. Additionally, a reflective layer or layers, such as a Bragg reflector structure (not shown), may be used between encapsulant layer 72 and the organic device layers to provide further protection to the organic device layers. It will be noted that the parylene-based materials are deposited at low temperatures, as described above. Therefore, the deposition of parylene-based materials as polymer encapsulant layer 72 may not cause any thermal damage to most organic light-emitting materials used in OLEDs.

Figure 7:
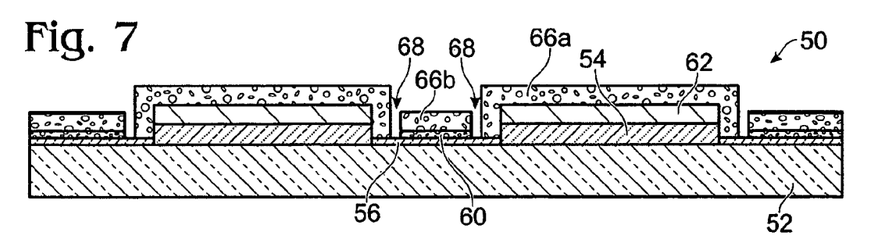
FIG. 7 is a schematic view of the substrate of FIG. 6, with separations formed in the polymer encapsulant layer.

Referring next to FIG. 7, after depositing polymer encapsulant layer 66, one or more separations or divisions 68 are formed in polymer encapsulant layer 66 between portions 66a of layer 66 that cover active device layers 62 and portions 66b of layer 66 that cover release layer 60 and electrical contact structures 56. Separations 68 allow portions 66b to be removed without disturbing portions 66a, and thereby help to preserve the integrity of the encapsulation of active device layers 62. Because portions 66a of polymer encapsulant film 66 protect active device layers 62, the separation formation steps may be performed under atmospheric conditions.

Separation 68 may be formed in any suitable manner. For example, in one exemplary embodiment, a laser is used to cut through polymer encapsulant layer 66. The use of laser ablation may offer the advantage that separation 68 may be formed without any resist patterning and etching steps. In the depicted embodiment, separation 68 is formed between the edges of release layer 60 and the edges of electronic control structure 54. However, separation 68 may be formed at any other suitable location that allows undesired portions of polymer encapsulant layer 66 to be removed without compromising the integrity of the desired portions of polymer encapsulant layer 66.

Figure 8:
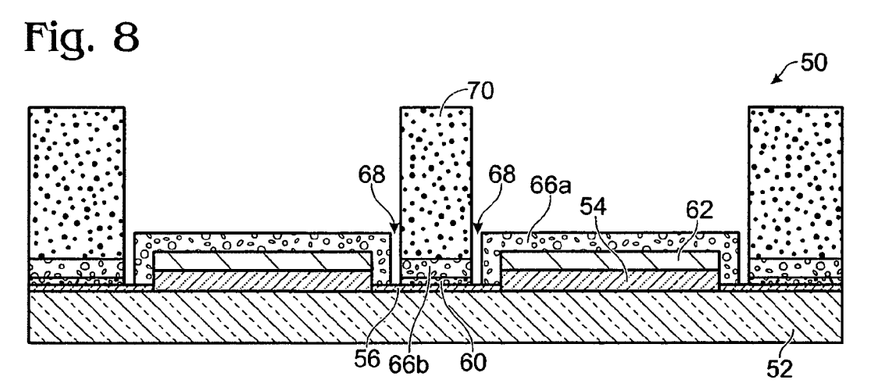
FIG. 8 is a schematic view of the substrate of FIG. 7, with an embodiment of a film removal structure adhered to portions of the polymer encapsulant layer covering the electrical contact structures.
Figure 9:
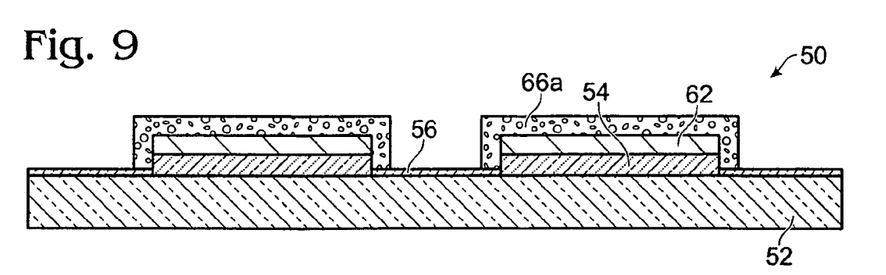
FIG. 9 is a schematic view of the substrate of FIG. 8, with the film removal structure, portions of the polymer encapsulant layer, and the release layer removed.

Next, portions 66b of polymer encapsulant film 66 are removed from over electrical contact structures 56. Any suitable method may be used to remove portions 66b. For example, as depicted in FIG. 8, a film removal structure 70 may be adhered to portions 66b of polymer encapsulant layer 66. Film removal structure 70 may then be peeled off of or otherwise removed, thereby causing removal of portions 66b of polymer encapsulant film 66 (and release layer 60), which remains adhered to film removal structure 70. As shown in FIG. 9, this leaves electrical control structure 54 and other active device layers 62 encapsulated by portion 66a of polymer encapsulant layer 66, while electrical contact structures 56 are exposed. The hermetically sealed device may be further protected via a hermetic sealing process as described in U.S. patent application Ser. No. 11/009,285 of Lee et al, the disclosure of which is hereby incorporated by reference.

Figure 10:
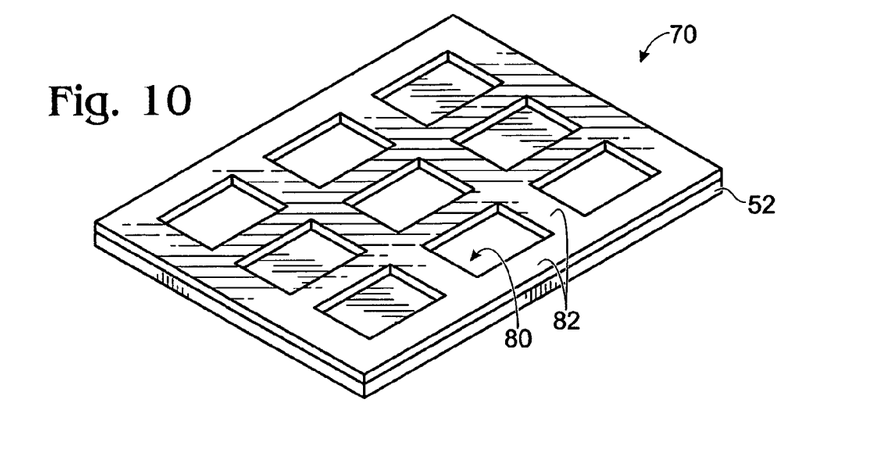
FIG. 10 is a schematic view of the substrate of FIG. 7, showing an alternate embodiment of a film removal structure.

Any suitable adhesive may be used to adhere film removal structure 70 to portions 66b of polymer encapsulant layer 66. Examples of suitable adhesives include, but are not limited to, pressure sensitive adhesives. In some embodiments, film removal structure 70 may be formed substantially entirely from a pressure sensitive adhesive, while in other embodiments, as shown in FIG. 10, film removal structure 70' may include a pressure sensitive adhesive 72' disposed on a support structure 74'. Suitable support structures may include, but are not limited to, plastic films (including but not limited to thin PET (polyethylene terephthalate), polyethylene and polypropylene sheets), metal sheets, and the like. Likewise, any suitable pressure sensitive material may be used to adhere film removal structure 70 to portion 66b of polymer encapsulant layer 66. Suitable pressure sensitive adhesives include those available from commercial sources such as Nitto Denko Corporation of Japan. Specific examples of suitable pressure sensitive adhesives may include E-MASK R Series pressure sensitive adhesive films from Nitto Chemical, and more specific examples may include the E-MASK R-100/R-200/R-300 pressure sensitive adhesive films from Nitto Chemical.

Figure 11:
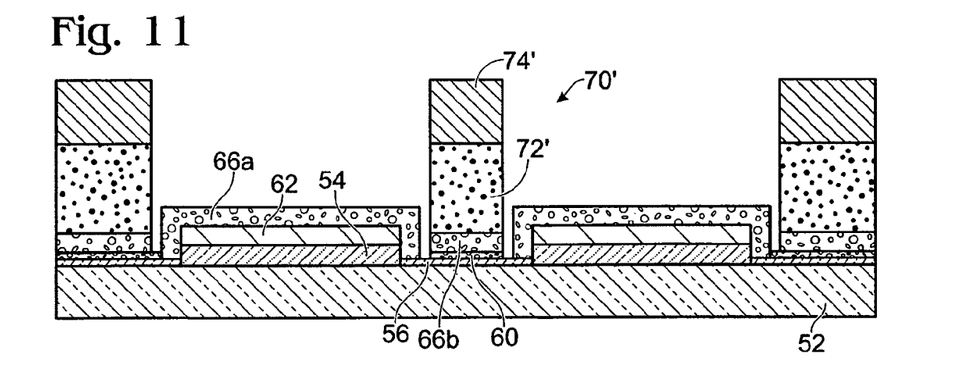
FIG. 11 is a perspective view of the film removal structures of FIG. 8 disposed over a substrate.

Film removal structure 70 may have any suitable structure. For example, where a single OLED is fabricated on a substrate, film removal structure 70 may have a frame-like configuration with an outer portion configured to contact the substrate at portions 66b of the polymer encapsulant film, and an inner opening configured not to contact portions 66a of the polymer encapsulant layer disposed over the active device portions. Likewise, as depicted in FIG. 11, in processes where a plurality of OLEDs are fabricated on a single substrate, film removal structure 70 may include a plurality of frame members 80 defining a plurality of openings 82, wherein each opening is configured to accommodate portions of the encapsulant layer disposed over active device regions of an OLED. It will be appreciated that these configurations are merely exemplary, and that film removal structure may have any other suitable configuration.

In some embodiments, additional encapsulant layers may be used to provide further protection from moisture and oxygen in air. For example, one or more inorganic encapsulant layers may be used in combination with polymer encapsulant layer 66. Likewise, more than one polymer encapsulant layer may be used, either with or without one or more inorganic encapsulant layers.

Figure 12:
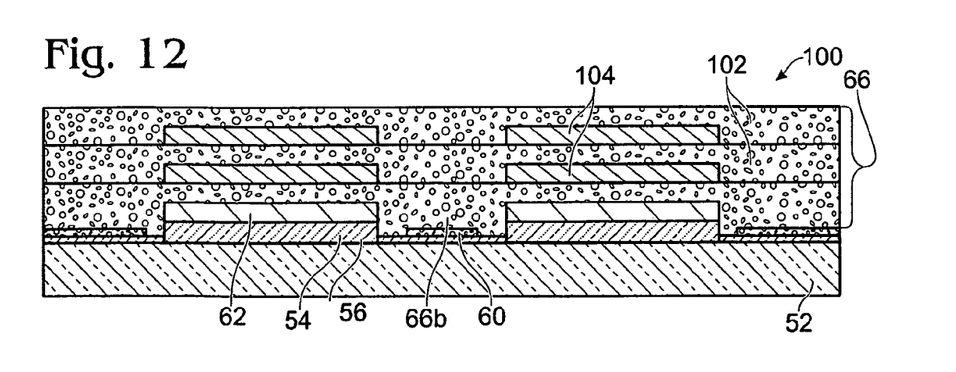
FIG. 12 is a schematic view of the substrate of FIG. 6, with an embodiment of a multi-layer encapsulant structure formed over the organic light-emitting structures and the electrical contact structures.
Figure 13:
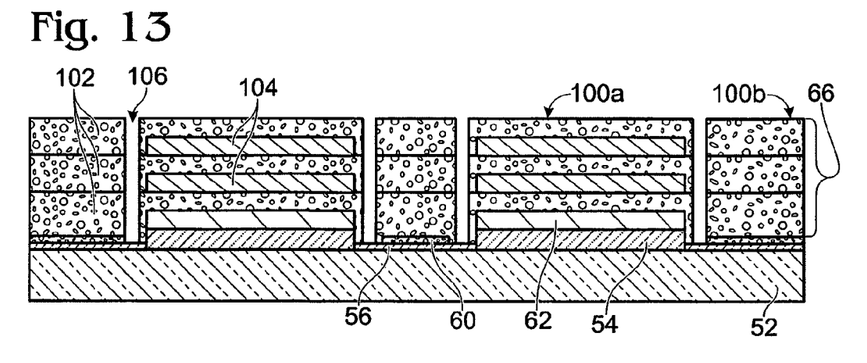
FIG. 13 is a schematic view of the substrate of FIG. 12, with a plurality of separations formed in the multi-layer encapsulant structure.

FIG. 12 illustrates one exemplary multi-layer encapsulant structure, generally at 100. Multi-layer encapsulant structure 100 includes a plurality of polymer encapsulant layers 102 and a plurality of inorganic polymer layers 104. In the depicted embodiment, each polymer layer 102 is separated from each nearest polymer layer 102 by a single inorganic layer 104. However, more than one inorganic layer may be disposed between adjacent polymer layers, and more than one polymer layer may be disposed between adjacent inorganic layers. Generally, it will be appreciated that an encapsulant structure may be formed from any suitable number of and/or combination of inorganic and polymer layers.

In the depicted multi-layer encapsulant structure 100, it can be seen that inorganic layers 104 are formed only over electrical control structures 54 and active device layers 62, while polymer layers 102 are formed over these structures as well as electrical contact structures 56. The selective deposition of inorganic layers 104 may be easily achieved using shadow masking techniques. This configuration may facilitate forming a separation (shown at 106 in FIG. 13) through the encapsulant layers for the patterning of the encapsulant layers, as the separation is formed in a region having only polymer material. Alternatively, both the polymer layers 102 and the inorganic layers 104 may be deposited over electrical contact structures 56.

Figure 14:
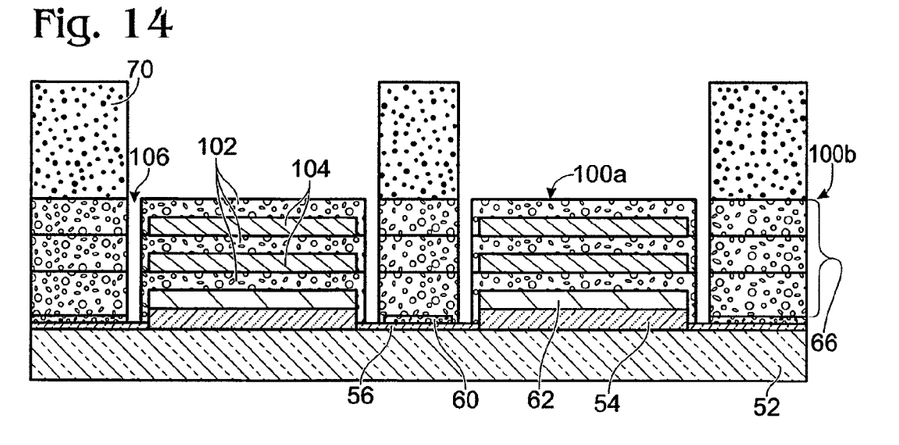
FIG. 14 is a schematic view of the substrate of FIG. 13, with an embodiment of a film removal structure adhered to portions of the multi-layer encapsulant structure covering the electrical contact structures.
Figure 15:
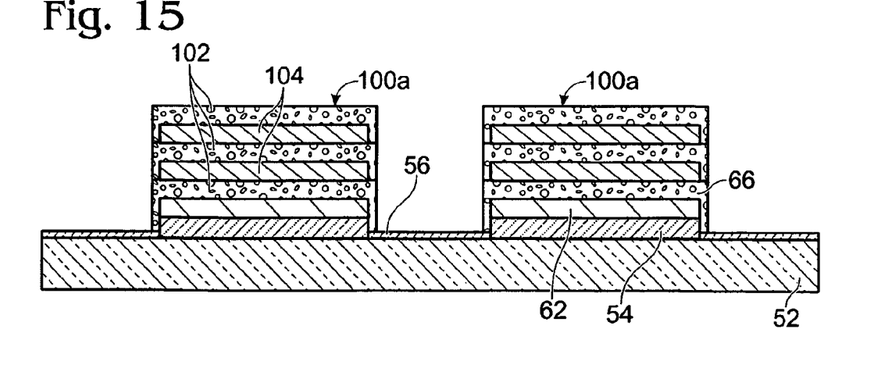
FIG. 15 is a schematic view of the substrate of FIG. 14, with the film removal structure, portions of the multi-layer encapsulant structure, and the release layer removed.

Next, as shown in FIG. 14, removal structure 70 may be applied to portions 100b of multi-layer encapsulant structure 100 as described above for polymer encapsulant layer 66. Finally, removal of removal structure 70, as shown in FIG. 15, causes removal of portions 100b of multi-layer encapsulant structure 100 and release layer 60, thereby exposing electrical contact structures 56 while leaving active device layers 62 encapsulated with portions 100a of multi-layer encapsulant film 100. If desired, an additional organic or inorganic encapsulant layer (not shown) may be used to seal the outer side edges of layers 102 and 104.

Any suitable materials may be used to form inorganic layers 104. Examples of suitable materials include, but are not limited to, alumina, $SiO_xC_yH_z$, $SiO_xF_y$, $SiO_2$, $Si_xO_yN_z$, SiC, and $Si_xN_y$. Likewise, inorganic barrier layer 34 may have any suitable thickness. Suitable thicknesses include, but are not limited to, thicknesses between 500 and 5000 Angstroms.

Where polymer encapsulant layers 102 are formed from one of the above-described parylene-based polymer materials, the thermal stability of the parylene-based polymer may allow the use of chemical vapor deposition (CVD) techniques to form inorganic layers 104. This is in contrast to the use of polyacrylates as polymer encapsulant layers 102, which are commonly used as encapsulant layers in OLEDs and which require the use of lower temperature techniques, such as sputtering, to form inorganic barrier layers. Examples of suitable CVD techniques include, but are not limited to, plasma CVD or downstream plasma CVD processes. These and other CVD techniques typically generate better quality films and allow higher throughput than sputtering techniques. However, it will be appreciated that sputtering, or any other suitable film deposition method, may be used to deposit inorganic layers 104.

Although the present disclosure includes specific embodiments of OLEDs, OLED encapsulant structures and methods of forming the encapsulant structures, specific embodiments are not to be considered in a limiting sense, because numerous variations are possible. The subject matter of the present disclosure includes all novel and nonobvious combinations and subcombinations of the various devices, films, encapsulant layers masks, processing methods, and other elements, features, functions, and/or properties disclosed herein. The description and examples contained herein are not intended to limit the scope of the invention, but are included for illustration purposes only.

The following claims particularly point out certain combinations and subcombinations regarded as novel and nonobvious. These claims may refer to "an" element or "a first" element or the equivalent thereof. Such claims should be understood to include incorporation of one or more such elements, neither requiring nor excluding two or more such elements. Other combinations and subcombinations of features, functions, elements, and/or properties may be claimed through amendment of the present claims or through presentation of new claims in this or a related application. Such claims, whether broader, narrower, equal, or different in scope to the original claims, also are regarded as included within the subject matter of the present disclosure.

What is claimed is:

1. A method of encapsulating an organic light-emitting device, wherein the device includes a light-emitting portion and an electrical contact portion, the method comprising:
   forming a polymer layer over the light-emitting portion and the electrical contact portion of the device;
   forming a separation in the polymer layer between a portion of the polymer layer disposed over the light-emitting portion of the device and a portion of the polymer layer disposed over the electrical contact portion of the device;
   adhering via an adhesive a film removal structure to the portion of the polymer layer disposed over the electrical contact portion of the device, wherein the film removal structure is adhered to a face of the polymer layer opposite the electrical contact portion such that the polymer layer underlies the film removal structure; and
   removing the film removal structure, thereby causing the removal of the adhesive and the portion of the polymer layer disposed over the electrical contact portion of the device.

2. The method of claim 1, wherein the separation is formed via laser ablation.

3. The method of claim 1, further comprising forming a release layer over the electrical contact portion before forming the polymer layer.

4. The method of claim 3, wherein the release layer is formed at least partially from an acrylosiloxane polymer.

5. The method of claim 3, wherein forming the release layer includes depositing a precursor material onto the electrical contact portion of the device and then causing polymerization of the precursor material to form the release layer.

6. The method of claim 3, wherein removing the film removal structure causes removal of the release layer.

7. The method of claim 1, wherein the film removal structure is adhered to the portion of the polymer layer disposed over the electrical contact portion of the device with a pressure sensitive adhesive.

8. The method of claim 7, wherein the film removal structure is formed substantially from the pressure sensitive adhesive.

9. The method of claim 7, wherein the film removal structure includes the pressure sensitive adhesive disposed on a support.

10. The method of claim 1, wherein the polymer layer is formed at least partially from a parylene-based material.

11. The method of claim 1, further comprising forming an inorganic encapsulant layer in contact with the polymer layer before forming the separation.

12. A method of forming an organic light-emitting device, comprising:
    forming a plurality of light-emitting structures and associated electrical contact structures on a substrate;
    forming a polymer encapsulant layer over the light-emitting structures and the electrical contact structures;
    forming at least one separation in the polymer encapsulant layer between portions of the polymer encapsulant layer that cover the light-emitting structures and portions of the polymer encapsulant layer that cover the electrical contact structures;
    adhering via an adhesive a film removal structure to the portions of the polymer layer disposed over the electrical contact structures, on a face of the polymer encapsulant layer opposite the substrate; and
    under atmospheric conditions, removing the film removal structure, thereby removing the portions of the polymer encapsulant layer underlying the film removal structure that cover the electrical contact structures.

13. The method of claim 12, wherein the film removal structure includes a plurality of openings configured to avoid contact with portions of the polymer encapsulant layer that cover the light-emitting structures.

14. The method of claim 12, wherein the film removal structure is adhered to the portions of the polymer layer disposed over the electrical contact structures with a pressure sensitive adhesive.

15. The method of claim 14, wherein the film removal structure is made substantially completely of the pressure sensitive adhesive.

16. The method of claim 14, wherein the film removal structure includes the pressure sensitive adhesive disposed on a support.

17. The method of claim 12, further comprising forming a release layer over the electrical contact structures before forming the light-emitting structures.

18. The method of claim 17, wherein the light-emitting structures are at least partially formed under vacuum.

19. The method of claim 17, wherein the release layer is formed at least partially from a acrylosiloxane polymer.

20. The method of claim 17, wherein the release layer is formed by depositing a precursor material onto the electrical contact structures and then causing polymerization of the precursor material.

21. The method of claim 12, wherein the polymer encapsulant layer is formed at least partially from a parylene-based material.

22. The method of claim 21, wherein the polymer material has a repeating unit having a general formula of —$CF_2C_6H_4CF_2$—.

23. The method of claim 12, further comprising forming an inorganic encapsulant layer in contact with the polymer encapsulant layer before forming the separation.

24. A method of forming an organic light-emitting device, comprising:
    forming an electrical contact structure on a substrate;
    forming a release layer over the electrical contact structure, wherein the release layer is configured to be substantially completely removable from the electrical contact structure;
    forming an organic light-emitting structure in electrical communication with the electrical contact structure;
    forming a polymer encapsulant layer over the release layer and the organic light-emitting structure;
    forming a separation in the polymer encapsulant layer between a portion of the polymer encapsulant layer over the organic light-emitting structure and a portion of the polymer encapsulant layer over the release layer;
    adhering a film removal structure to the portion of the polymer encapsulant disposed over the release layer; and
    removing the release layer and the portion of the polymer encapsulant layer over the release layer under atmospheric conditions by removing the film removal structure.

25. The method of claim 24, wherein forming a release layer includes depositing a precursor material over the electrical contact structure and then causing polymerization of the precursor material.

26. The method of claim 25, further comprising depositing an electrical control structure on the substrate before depositing the precursor material, and masking the electrical control structure with a shadow mask while depositing the precursor material.

27. The method of claim 24, wherein the release layer is made at least partially of an acrylosiloxane polymer.

28. The method of claim 24, wherein removing the release layer and the portion of the polymer encapsulant layer over the release layer includes adhering a film removal structure to the portion of the polymer encapsulant layer over the release layer, and then removing the film removal structure, thereby causing removal of the release layer and the portion of the polymer encapsulant layer over the release layer.

29. The method of claim 28, wherein the removal structure is adhered to the portion of the polymer encapsulant layer over the release layer with a pressure sensitive adhesive.

30. The method of claim 29, wherein the film removal structure is made substantially entirely of the pressure sensitive adhesive.

31. The method of claim 29, wherein the film removal structure includes the pressure sensitive adhesive disposed on a support.

32. The method of claim 24, further comprising forming an inorganic encapsulant layer in contact with the polymer encapsulant layer before forming the separation.

33. The method of claim 24, wherein the organic light-emitting structures are at least partially formed under vacuum.

* * * * *